(12) United States Patent
Puzenat et al.

(10) Patent No.: US 9,429,596 B2
(45) Date of Patent: Aug. 30, 2016

(54) CURRENT MEASUREMENT FOR AN ELECTRIC HEATER

(75) Inventors: Bertrand Puzenat, Montigay le Bretonneux (FR); Laetitia Gestas, Bures sur Yvette (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 447 days.

(21) Appl. No.: 13/883,876

(22) PCT Filed: Nov. 9, 2011

(86) PCT No.: PCT/EP2011/069714
§ 371 (c)(1),
(2), (4) Date: Jul. 18, 2013

(87) PCT Pub. No.: WO2012/062789
PCT Pub. Date: May 18, 2012

(65) Prior Publication Data
US 2013/0285646 A1 Oct. 31, 2013

(30) Foreign Application Priority Data
Nov. 9, 2010 (FR) ..................... 10 04379

(51) Int. Cl.
*G01R 1/02* (2006.01)
*G01R 19/00* (2006.01)
*G01R 35/00* (2006.01)

(52) U.S. Cl.
CPC ......... *G01R 19/003* (2013.01); *G01R 19/0092* (2013.01); *G01R 35/005* (2013.01); *G01R 35/00* (2013.01)

(58) Field of Classification Search
None
See application file for complete search history.

(56) References Cited

U.S. PATENT DOCUMENTS

| 4,804,903 | A | 2/1989 | Yundt |
| 6,828,753 | B2 | 12/2004 | Grasso et al. |
| 2005/0053367 | A1 | 3/2005 | Fulton |
| 2007/0085546 | A1* | 4/2007 | Virolainen ................... 324/348 |

FOREIGN PATENT DOCUMENTS

| EP | 1841052 A2 | 3/2007 |
| JP | 2006-064627 A | 3/2006 |

OTHER PUBLICATIONS

English language abstract and translation for JP 2006-064627 extracted from PAJ database on Sep. 9, 2013, 31 pages.
International Search Report for Application No. PCT/EP2011/069714 dated Jan. 27, 2012, 7 pages.

* cited by examiner

*Primary Examiner* — Paresh Patel
(74) *Attorney, Agent, or Firm* — Howard & Howard Attorneys PLLC

(57) ABSTRACT

The invention relates to a method for measuring a current or voltage output quantity of a switched-mode power supply circuit (H), referred to as a chopper circuit, of period T and of cyclic ratio α, belonging to the interval ]0; 1[, such that, at each period, the supply current is non-zero during an "ON" phase of duration αT, and zero during an "OFF" phase of duration (1−α)T. The measurement method includes the following steps: measuring the value $G_{on}$ of an image of the output quantity during an "ON" phase; measuring the value $G_{off}$ of an image of the output quantity during an "OFF" phase; calculating the difference $\Delta G = G_{on} - G_{off}$; and using the difference $\Delta G$ for evaluating the output quantity.

16 Claims, 1 Drawing Sheet

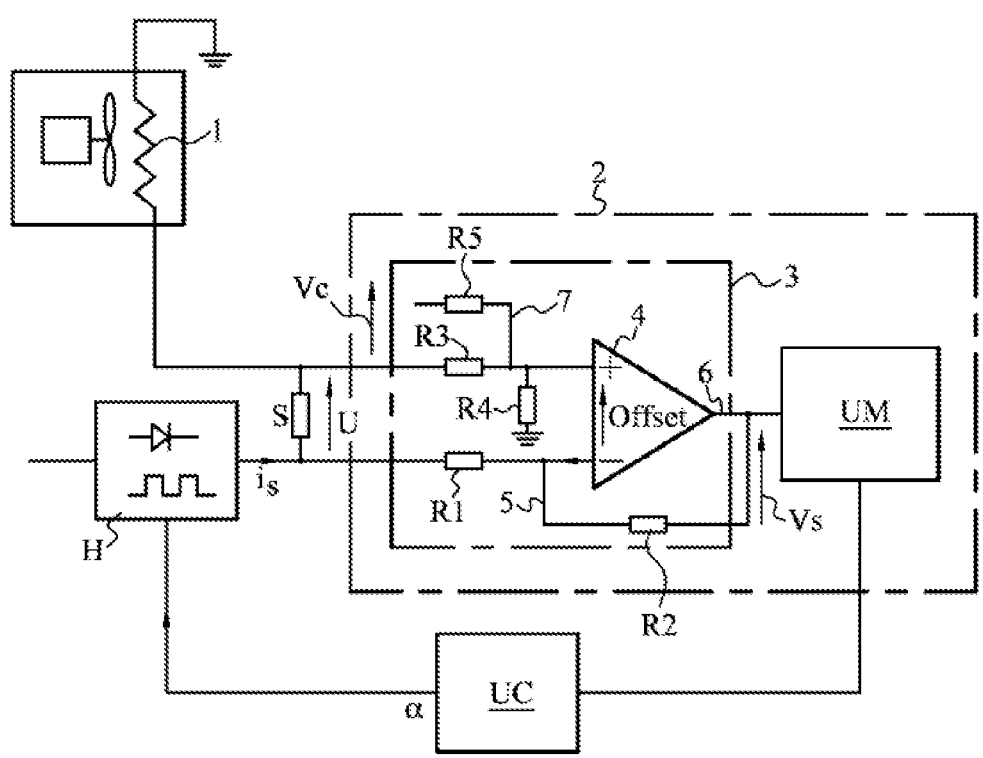

CURRENT MEASUREMENT FOR AN ELECTRIC HEATER

RELATED APPLICATIONS

This application is the National Stage of International Patent Application No. PCT/EP2011/069714, filed on Nov. 9, 2011, which claims priority to and all the advantages of French Patent Application No. FR 10/04379, filed on Nov. 9, 2010, the content of which is incorporated herein by reference.

The present invention relates to the technical field of the switched-mode power supplies, also called chopper circuits, used for example to power electric heating elements or even direct current electric motors.

A switched-mode power supply circuit, called chopper circuit, is designed to cyclically deliver a voltage and/or an electric current for a fraction, of variable duration, of each cycle or period of its operation. The speed of such a chopper is defined by its period T and its duty cycle α which belong to the interval]0; 1[. Thus, at each period or cycle, the power supply current is, on the one hand, non-zero during an "on" phase of duration αT and, on the other hand, zero during an "off" phase of duration (1−α)T. By modulating the value of the duty cycle, it is then possible to vary the average power powering the load connected to the chopper circuit.

Such a chopper circuit has numerous applications, notably in the electric heating applications where the modulation of the duty cycle makes it possible to regulate the average heat power delivered by an electric heating element.

In order to monitor the operation of the chopper circuit, either for safety purposes to avoid any deterioration of the electric circuits which are connected thereto or of its power components, or for regulation purposes to know the average power actually delivered by the chopper circuit, it is necessary to evaluate the output current and/or voltage of the chopper circuit. To this end, it is known practice to implement measurement systems involving one or more operational amplifiers measuring either directly the output voltage or the voltage at the terminals of a measurement resistor, also called shunt, in which the output current flows, to deduce therefrom the value of this output current.

However, each operational amplifier presents the drawback of having an offset voltage between its inverting input and its non-inverting input. This offset voltage, also called input offset voltage or simply offset, at the input of the operational amplifier, then generates a measurement error which is amplified by the amplifier itself.

In order to remedy this drawback, an operational amplifier can be chosen that has an offset voltage, as low as possible, that is compatible with the voltage values that it is to measure. However, the operational amplifiers that exhibit a very low offset voltage are relatively costly.

In the case of current measurement by means of a measurement resistor, it is possible to try to compensate the error induced by the offset voltage by choosing a value of the measurement resistor that is high enough for the value of the error to exhibit a low relative share in relation to the measured value. However, increasing the value of the measurement resistor induces great heat dissipation and therefore the need to apply heat dissipation systems thereby increasing the overall cost of the power supply. Furthermore, this heat dissipation on the measurement resistor adversely affects the efficiency of the power supply.

In order to remedy the above drawbacks, there has therefore emerged the need for a method and a device which make it possible to perform reliable measurements without having to use an operational amplifier with low offset or even a measurement resistor of high value.

In order to achieve this objective, the invention relates to a method for measuring a current or voltage output quantity of a switched-mode power supply circuit, called chopper circuit, of period T and of duty cycle α, belonging to the interval]0; 1[, such that, at each period, the power supply current is, on the one hand, non-zero during an "on" phase of duration αT and, on the other hand, zero during an "off" phase of duration (1−α)T. According to the invention, this measurement method comprises the following steps:

measurement of the value $G_{on}$ of an image of the output quantity during an "on" phase, measurement of the value $G_{off}$ of an image of the output quantity during an "off" phase, calculation of the difference $\Delta G = G_{on} - G_{off}$ use of the difference $\Delta G$ to evaluate the output quantity.

Thus, since the offset voltage induced by the amplification or the measurement errors are the same during the "off" phase and during the "on" phase, an evaluation of the output quantity is obtained which is unaffected by the offset voltage or by the measurement errors. The invention therefore makes it possible to obtain a permanent calibration of the measurement.

According to one implementation of the invention, the $G_{on}$ and $G_{off}$ measurements are performed during the "on" and "off" phases of one and the same period.

According to a variant of this implementation, the $G_{on}$ and $G_{off}$ measurements are performed at a frequency higher than the power supply switching frequency.

According to one implementation of the invention, the $G_{on}$ and $G_{off}$ measurements are each performed during the respective "on" and "off" phase of two consecutive periods.

According to the invention, the evaluated or measured quantity can be the output voltage or even the output current of the chopper power supply circuit. Thus, according to a feature of the invention, the evaluated quantity is the output current and the measured images correspond to an amplified value of the voltage at the terminals of a measurement resistor in which the output current flows.

According to a feature of the invention, a correction component is added to the evaluated quantity. Thus, in the context of the evaluation of the output current, the measured images then correspond to an amplified value of the sum, on the one hand, of the voltage at the terminal of a measurement resistor in which the output current flows and, on the other hand, of a correction voltage of constant value. The implementation of such a correction component makes it possible to compensate the offset due to the amplification defects.

According to a variant of the invention, the correction voltage is a positive DC voltage, which makes it possible to compensate the offsets of negative value.

The invention also relates to a device for measuring a voltage or current output quantity of a switched-mode power supply circuit, called chopper circuit, of period T and of duty cycle α belonging to the interval]0; 1[, such that, at each period, the power supply current is normally, on the one hand, non-zero during an "on" phase of duration αT and, on the other hand, zero during an "off" phase of duration (1−α)T. In order to allow for the implementation of the method according to the invention, this measurement device comprises:

a circuit for amplifying a representative voltage of the quantity to be measured, a unit for measuring the amplified voltage at the output of the amplification circuit, which is designed to:

measure the value $G_{on}$ of the amplified voltage during an "on" phase, measure the $G_{off}$ value of the amplified voltage during an "off" phase, calculate the difference $\Delta G = G_{on} - G_{off}$ use the value of the difference $\Delta G$ to evaluate the output quantity.

According to one embodiment of the invention, the measurement device comprises a circuit for adding) at the input of the amplification circuit) a correction voltage to the voltage representative of the measured quantity.

According to a feature of this embodiment, the correction voltage is a positive DC voltage.

According to a variant embodiment of the invention, the measurement unit is designed to perform the $G_{on}$ and $G_{off}$ measurements during the "on" and "off" phases of one and the same period.

According to a feature of this variant, the measurement unit is designed to perform the $G_{on}$ and $G_{off}$ measurements at a frequency higher than the power supply switching frequency.

According to another feature of this variant embodiment, the measurement unit is designed to calculate the difference $\Delta$ at a frequency lower than the power supply switching frequency.

According to a variant embodiment of the invention, the measurement unit is designed to perform the $G_{on}$ and $G_{off}$ measurements during "on" and "off" phases of two different periods.

According to one embodiment of the invention, the device is designed to measure the output current of the chopper circuit and comprises a measurement resistor in which the output current flows, the amplification circuit being designed to amplify the voltage at the terminals of the measurement resistor.

Obviously, the various features, variants and embodiments of the invention can be associated with one another in various combinations inasmuch as they are not mutually incompatible or exclusive.

Moreover, various other features of the invention emerge from the following detailed description, given with reference to the single appended FIGURE which schematically illustrates a nonlimiting embodiment of a measurement device implementing the method according to the invention to measure the output current of a switched-mode power supply circuit.

According to the example illustrated, the invention is implemented in the context of monitoring and regulating the operation of an electric heating element 1 used for the heating of a vehicle passenger compartment. The heating element 1 is powered by a switched-mode power supply circuit, also called chopper H. This power supply circuit H has an operating period T and a duty cycle $\alpha$ that can vary within the interval ]0; 1[. The power supply circuit H is driven by a control unit UC which modulates the value of the duty cycle $\alpha$ as a function of the heating power desired from the heating element 1. At each period T, both in the time interval [nT; nT+$\alpha$T], called "on" phase, the output current Is has a non-zero value whereas, in the time interval [nT+$\alpha$T; (n+1)T], called "off" phase, the output current Is is zero.

In order to know the heating power actually supplied by the heating element 1 or even to check that the output current delivered by the power supply circuit H is acceptable for the electric cables linking the power supply circuit H to the heating element 1, it is proposed to measure the output current Is. To this end, a measurement resistor S, also called "Shunt", is implemented, which is connected in series with the heating element 1. As is known, the measurement of the voltage U at the terminals of the latter makes it possible to evaluate the value of the output current Is delivered to the heating element 1.

The invention therefore proposes to implement a measurement device 2 which will proceed to amplify the voltage U by means of an amplification circuit 3 in order to then evaluate this voltage by means of a measurement unit UM.

According to the example illustrated, the amplification circuit 3 comprises an operational amplifier 4, the inverting input (−) of which is connected via a resistor R1 to a first terminal of the measurement resistor S. The amplification circuit 3 also comprises a reverse feedback line 5 which links, through a resistor R2, the inverting input (−) to the output 6 of the operational amplifier 4. The non-inverting input (+) of the operational amplifier is also connected to the second terminal of the measurement resistor S via a resistor R3 as well as to the ground by a resistor R4. Finally, the amplification circuit 3 comprises a circuit 7 for adding a correction voltage which is formed by a resistor R5, of which one terminal is connected to the non-inverting input (+) while the other is powered by a DC correction voltage Vc of constant value.

According to the invention, the power supply circuit, the measurement resistor, the amplification circuit and the measurement unit can be produced in the form of a single integrated circuit or in the form of discrete components associated with one another or even in the form of a combination of integrated circuits and discrete components.

The voltage Vs at the output of the amplification circuit is given by the following relationship:

$$Vs = \left(\frac{R2}{R1} + 1\right)\left(R345\left(\frac{Vc}{R5} + \frac{U}{R3}\right) - \text{Offset}\right)$$

in which:

R345=R3//R4//R5, or the resistance equivalent to the three resistors R3, R4, R5 in parallel, and Offset is the offset voltage, called Offset, between the inverting input (−) and the non-inverting input (+) of the operational amplifier 4.

Moreover, to avoid suffering saturation effects, $$R345\left(\frac{Vc}{R5}\right)$$

will preferably be chosen to be greater than the maximum value likely to be encountered for the absolute value of the offset voltage Offset.

The measurement unit UM is then designed to measure, on the one hand, the value $G_{on}$ of the output voltage Vs during each "on" phase and the value $G_{off}$ of the output voltage Vs during each "off" phase. The measurement unit UM is preferably designed to have a sampling period smaller than the chopping period T of the power supply circuit. The sampling period may, for example, be less than or equal to 1/10th of the chopping period T. Thus, there will be several measurements of the $G_{on}$ value and of the $G_{off}$ value during each chopping period.

Since, during the "off" phases the output current of the power supply circuit H is zero, the $G_{off}$ value corresponds to the error induced by the offset attention Offset.

By calculating the difference $\Delta G = G_{on} - G_{off}$, the measurement unit will cancel the error induced by the offset voltage offset so that ΔG will be perfectly proportional to the output current during the "on" phase. This calculation of the difference ΔG can, for example, be performed both periods T per measurement unit.

The measurement unit calculates or evaluates, from ΔG, the value of the output current. This evaluation of the output current will then be able to be used by the control unit UC to control the duty cycle α of the power supply circuit H so as to regulate the power available on the heating element 1, to ensure that the output current does not exceed a value the value that is acceptable for the electric wiring or even identify a possible malfunction of the power supply circuit.

According to the preceding example, the output current of the power supply circuit is evaluated, but the invention could also be implemented to evaluate the output voltage of the power supply circuit during each "on" phase.

Obviously, various modifications, in particular with regard to the constituent components of the power supply circuit and/or of the amplification circuit, can be made to the invention within the framework of the appended claims.

The invention claimed is:

1. A method for measuring a current or voltage output quantity of a switched-mode power supply circuit, called chopper circuit, of period T and of duty cycle α, belonging to the interval]0; 1[, such that, at each period, the power supply current is non-zero during an on phase of duration αT and zero during an off phase of duration (1−α)T, wherein the measurement method comprises the following steps:
    measuring the value $G_{on}$ of the current or voltage output quantity during an on phase;
    measuring the value $G_{off}$ of the current or voltage output quantity during an off phase;
    calculating the difference $\Delta G = G_{on} - G_{off}$; and
    using the difference ΔG to evaluate the current or voltage output quantity.

2. The measurement method as claimed in claim 1, wherein the $G_{on}$ and $G_{off}$ measurements are performed during the on and off phases of one and the same period.

3. The measurement method as claimed in claim 2, wherein the $G_{on}$ and $G_{off}$ measurements are performed at a frequency higher than the power supply switching frequency.

4. The measurement method as claimed in claim 1, wherein the $G_{on}$ and $G_{off}$ measurements are each performed during the respective on and off phase of two consecutive periods.

5. The measurement method as claimed in claim 1, wherein a correction component is added to the evaluated quantity before measurement.

6. The measurement method as claimed in claim 1, wherein the evaluated quantity is the output current and the measured images correspond to an amplified value of the voltage at the terminals of a measurement resistor in which the output current flows.

7. The measurement method as claimed in claim 1, wherein the evaluated quantity is the output current and the measured images correspond to an amplified value of the sum, on the one hand, of the voltage at the terminal of a measurement resistor in which the output current flows and, on the other hand, of a correction voltage of constant value.

8. The measurement method as claimed in claim 7, wherein the correction voltage is a positive DC voltage.

9. A device for measuring an output quantity of a switched-mode power supply circuit, called chopper circuit, of period T and of duty cycle α, belonging to the interval]0; 1[, such that, at each period, the power supply current is normally-non-zero during an on phase of duration αT and zero during an off phase of duration (1−α)T, the device comprising:
    a circuit for amplifying a representative voltage of the quantity to be measured; and
    a unit for measuring the amplified voltage at the output of the amplification circuit, which is designed to:
        measure the value $G_{on}$ of the amplified voltage during an on phase;
        measure the $G_{off}$ value of the amplified voltage during an off phase,
        calculate the difference $\Delta G = G_{on} - G_{off}$; and
        use the value of the difference ΔG to evaluate the output quantity.

10. The measuring device as claimed in claim 9, further comprising a circuit for adding, at the input of the amplification circuit, a correction voltage to the voltage representative of the measured quantity.

11. The measuring device as claimed in claim 10, wherein the correction voltage is a positive DC voltage.

12. The measuring device as claimed in claim 9, wherein the measurement unit is designed to perform the $G_{on}$ and $G_{off}$ measurements during the on and off phases of one and the same period.

13. The measuring device as claimed in claim 12, wherein the measurement unit is designed to perform the $G_{on}$ and $G_{off}$ measurements at a frequency higher than the power supply switching frequency.

14. The measuring device as claimed in claim 13, wherein the measurement unit is designed to calculate the difference ΔG at a frequency lower than the power supply switching frequency.

15. The measuring device as claimed in claim 9, wherein the measurement unit is designed to perform the $G_{on}$ and $G_{off}$ measurements during on and off phases of two different periods.

16. The measuring device as claimed in claim 9, wherein it is designed to measure the output current of the chopper circuit and comprises a measurement resistor in which the output current flows, the amplification circuit being designed to amplify the voltage at the terminals of the measurement resistor.

* * * * *